United States Patent
Parthasarathy et al.

(10) Patent No.: US 8,723,227 B2
(45) Date of Patent: May 13, 2014

(54) HETEROJUNCTION COMPOUND SEMICONDUCTOR PROTECTION CLAMPS AND METHODS OF FORMING THE SAME

(71) Applicant: Analog Devices, Inc., Norwood, MA (US)

(72) Inventors: Srivatsan Parthasarathy, Acton, MA (US); Javier Alejandro Salcedo, North Billerica, MA (US); Shuyun Zhang, Allston, MA (US)

(73) Assignee: Analog Devices, Inc., Norwood, MA (US)

( * ) Notice: Subject to any disclaimer, the term of this patent is extended or adjusted under 35 U.S.C. 154(b) by 37 days.

(21) Appl. No.: 13/625,611

(22) Filed: Sep. 24, 2012

(65) Prior Publication Data

US 2014/0084331 A1    Mar. 27, 2014

(51) Int. Cl.
*H01L 29/66* (2006.01)
*H01L 21/336* (2006.01)

(52) U.S. Cl.
USPC .... 257/194; 257/195; 257/121; 257/E21.403; 257/E29.246; 438/285; 438/590; 438/48

(58) Field of Classification Search
CPC ............ H01L 29/2003; H01L 29/66462; H01L 29/7787; H01L 29/7783; H01L 27/0623; H01L 29/42316; H01L 21/0254; H01L 21/28264
USPC .......... 257/194, 195, 121, E29.246, E29.247, 257/E29.248, E21.403; 438/48, 60, 285, 438/590
See application file for complete search history.

(56) References Cited

U.S. PATENT DOCUMENTS

2012/0262828 A1* 10/2012 Muthukrishnan et al. ...... 361/56

OTHER PUBLICATIONS

Lin et al., "*The Monolithic Integration of InGaAs pHEMT and InGaP HBT Technology for Single-Chip WiMAX RF Front-End Module*", HBT Technology Department, WIN Semiconductors Corp, MWSCAS 2011 IEEE, 4 pages.
Gupta et al., "*InGaP-Plus™—A major advance in GaAs HBT Technology*", Anadigics, Inc., CSIC 2006 IEEE, pp. 179-182.
Peatman et al., "*InGaP-Plus™: Advanced GaAs BiFET Technology and Applications*", Anadigics, Inc., CS Mantech Conference, May 2007, pp. 243-246.
Streit et al., "*Monolithic HEMT-HBT Integration for Novel Microwave Circuit Applications*", TRW Electronic Systems and Technology Division, GaAs IC Symposium, 1994 IEEE, pp. 329-332.

(Continued)

*Primary Examiner* — Thinh T Nguyen
(74) *Attorney, Agent, or Firm* — Knobbe, Martens, Olson & Bear, LLP

(57) ABSTRACT

A protection clamp is provided between a first terminal and a second terminal, and includes a multi-gate high electron mobility transistor (HEMT), a current limiting circuit, and a forward trigger control circuit. The multi-gate HEMT includes a drain/source, a source/drain, a first depletion-mode (D-mode) gate, a second D-mode gate, and an enhancement-mode (E-mode) gate disposed between the first and second D-mode gates. The drain/source and the first D-mode gate are connected to the first terminal and the source/drain and the second D-mode gate are connected to the second terminal. The forward trigger control and the current limiting circuits are coupled between the E-mode gate and the first and second terminals, respectively. The forward trigger control circuit provides an activation voltage to the E-mode gate when a voltage of the first terminal exceeds a voltage of the second terminal by a forward trigger voltage.

20 Claims, 4 Drawing Sheets

(56) References Cited

OTHER PUBLICATIONS

Streit et al., *"Monolithic HEMT-HBT Integration by Selective MBE"*, IEEE Transactions on Electron Devices, vol. 42, No. 4, Apr. 1995, pp. 618-623.

Ho et al., *"A GaAs BiFET LSI Technology"*, GaAs IC Symposium, 1994 IEEE, pp. 47-50.

Chang, M. F., *"Heterojunction BiFET Technology for High Speed Electronic Systems"*, WOFE 1997 IEEE, pp. 15-20.

Chang, M. F., *"A Manufacturable GaAs BiFET Technology for High Speed Signal Processing"*, ISSSE 1995 IEEE, pp. 279-282.

Cui, et al., *"Development of a New pHEMT-Based Electrostatic Discharge Protection Structure"*, IEEE Transactions on Electron Devices, vol. 58, No. 9, Sep. 2011.

\* cited by examiner

HETEROJUNCTION COMPOUND SEMICONDUCTOR PROTECTION CLAMPS AND METHODS OF FORMING THE SAME

CROSS-REFERENCE TO RELATED APPLICATIONS

This application is related to U.S. application Ser. No. 13/625,577, entitled "BIDIRECTIONAL HETEROJUNCTION COMPOUND SEMICONDUCTOR PROTECTION DEVICES AND METHODS OF FORMING THE SAME" (Inventors: Javier Alejandro Salcedo, Srivatsan Parthasarathy, and Shuyun Zhang; filed on even date herewith), the disclosure of which is incorporated herein by reference in its entirety.

BACKGROUND

1. Field

Embodiments of the invention relate to electronic systems, and more particularly, to protection devices for compound semiconductor circuitry, such as gallium arsenide (GaAs) circuitry.

2. Description of the Related Technology

Electronic circuits can be exposed to a transient electrical event, or an electrical signal of a relatively short duration having rapidly changing voltage and high power. Transient electrical events can include, for example, electrical discharge/electrostatic overstress (ESD/EOS) events arising from the abrupt release of charge from an object or person to an electronic circuit. Transient electrical events can damage an integrated circuit (IC) due to overvoltage conditions and/or high levels of power dissipation over relatively small areas of the IC. High power dissipation can increase circuit temperature, and can lead to numerous problems, such as junction damage, metal damage, and/or surface charge accumulation.

Transient electrical event protection can be difficult to provide for certain gallium arsenide (GaAs) or other compound semiconductor circuitry, including, for example, radio frequency (RF) power amplifiers, attenuators, gain blocks, multi-voltage circuits, drivers, and/or switches. For instance, conventional ESD/EOS protection devices can have a large parasitic capacitance that can adversely impact circuit gain, linearity, and/or bandwidth, and thus can be unsuitable for protecting such circuits. Additionally, the performance of ESD/EOS protection devices can be limited by the relatively low thermal conductivity and/or current-handling capability associated with compound semiconductor technologies. Accordingly, there is a need for improved devices and circuits for providing protection to compound semiconductor circuitry.

SUMMARY

In one embodiment, an apparatus includes a multi-gate high electron mobility transistor (HEMT) including a drain/source, a source/drain, a first depletion-mode (D-mode) gate, a second D-mode gate, and an enhancement-mode (E-mode) gate. The E-mode gate is disposed between the first and second D-mode gates. The drain/source and the first D-mode gate are electrically connected to a first terminal, and the source/drain and the second D-mode gate are electrically connected to a second terminal. The current limiting circuit is electrically connected between the E-mode gate and the second terminal. The apparatus further includes a forward trigger control circuit electrically connected between the first terminal and the E-mode gate, and the forward trigger control circuit is configured to conduct a trigger current when a voltage of the first terminal exceeds a voltage of the second terminal by a forward trigger voltage. The trigger current is configured to turn-on the E-mode gate to provide a forward conduction path between the first terminal and the second terminal.

In another embodiment, an apparatus includes a substrate, a heterojunction structure disposed over the substrate, a drain/source region disposed over the heterojunction structure and electrically connected to a first terminal, a source/drain region disposed over the heterojunction structure and electrically connected to a second terminal, an E-mode gate region disposed over the heterojunction structure between the drain/source region and the source/drain region, a first D-mode gate region disposed over the heterojunction structure between the drain/source region and the E-mode gate region, a second D-mode gate region disposed over the heterojunction structure between the source/drain region and the E-mode gate region, a current limiting circuit electrically connected between the E-mode gate region and the second terminal, and a forward trigger control circuit electrically connected between the first terminal and the E-mode gate region. The first D-mode gate region is electrically connected to the first terminal, and the second D-mode gate region is electrically connected to the second terminal.

In another embodiment, a method of making a protection clamp is provided. The method includes forming a heterojunction structure over a substrate, forming a drain/source region over the heterojunction structure, forming a source/drain region over the heterojunction structure, forming an E-mode gate region over the heterojunction structure, forming a first D-mode gate region over the heterojunction structure, forming a second D-mode gate region disposed over the heterojunction structure, forming a current limiting circuit, and forming a forward trigger control circuit. The E-mode gate region is disposed between the drain/source region and the source/drain region, and the first D-mode gate region is disposed between the drain/source region and the E-mode gate region. Additionally, the second D-mode gate region is disposed between the source/drain region and the E-mode gate region. The current limiting circuit includes a first terminal electrically connected to the E-mode gate region and a second terminal electrically connected to the second D-mode gate region and to the source/drain region. The forward trigger control circuit includes a first terminal electrically connected to the E-mode gate region and a second terminal electrically connected to the first D-mode gate region and to the drain/source region.

DETAILED DESCRIPTION OF CERTAIN EMBODIMENTS

Figure 1:
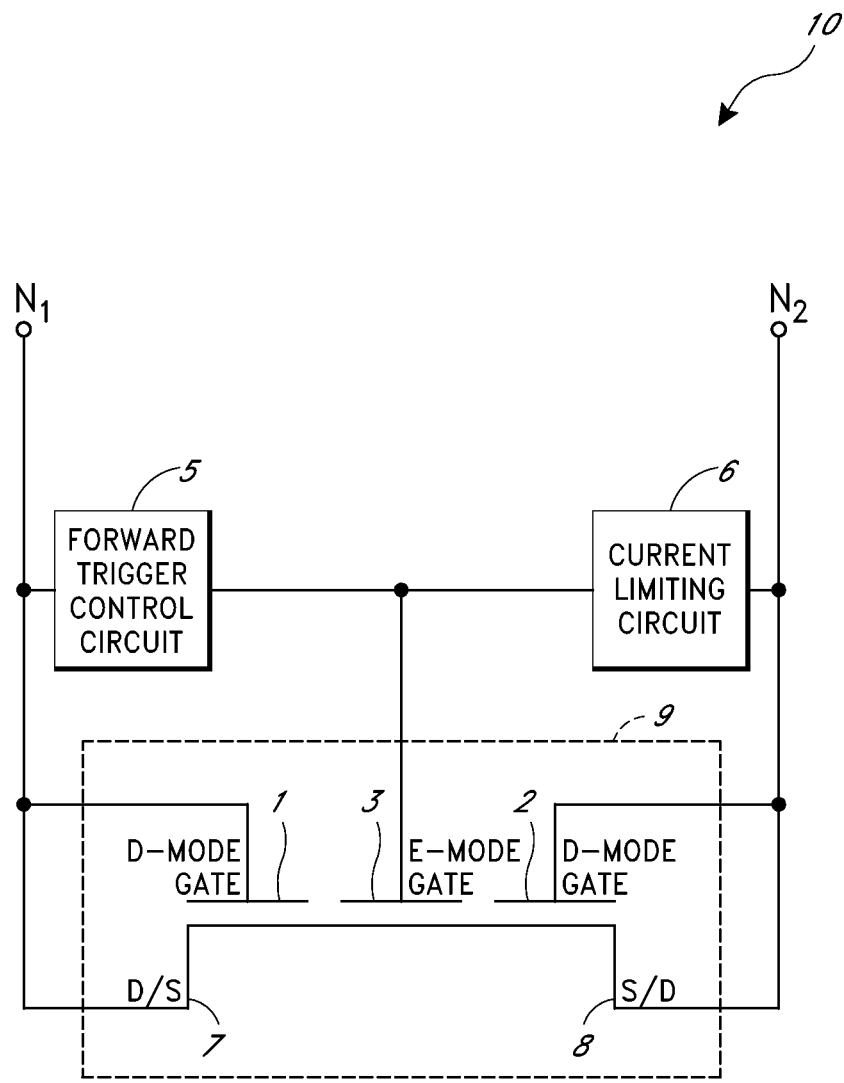
FIG. 1 is a circuit diagram of one embodiment of a heterojunction protection clamp.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Heterojunction protection clamps and methods of forming the same are provided. In certain implementations, a protection clamp is provided between a first terminal and a second terminal, and includes a multi-gate high electron mobility transistor (HEMT), a current limiting circuit, and a forward trigger control circuit. The multi-gate HEMT includes a drain/source, a source/drain, a first depletion-mode (D-mode) gate, a second D-mode gate, and an enhancement-mode (E-mode) gate disposed between the first and second D-mode gates. The multi-gate HEMT is electrically connected between the first and second terminals with the drain/source and the first D-mode gate coupled to the first terminal, and with the source/drain and the second D-mode gate coupled to the second terminal. Additionally, the forward trigger control circuit is coupled between the first terminal and the E-mode gate, and the current limiting circuit is coupled between the second terminal and the E-mode gate.

The forward trigger control circuit can conduct a trigger current when a voltage of the first terminal exceeds a voltage of the second terminal by a forward trigger voltage. The trigger current can turn on or activate the E-mode gate to provide a forward conduction path between the first and second terminals. For relatively large overvoltage conditions, a portion of the trigger current can pass or flow through the current limiting circuit and further increase the voltage difference between the E-mode gate and the source/drain, thereby reducing the protection clamp's on-state resistance. The forward conduction path includes a first current path through a two dimensional electron gas (2DEG) region or channel of the multi-gate HEMT and a second current path through a metal-semiconductor or Schottky diode structure associated with the first D-mode gate. The protection clamp can also provide protection against undervoltage events by providing a reverse conduction path when the voltage of the second terminal exceeds the voltage of the first terminal by a reverse trigger voltage, which in certain implementations can be about equal to the threshold voltage of the E-mode gate.

FIG. 1 is a circuit diagram of one embodiment of a protection circuit or heterojunction protection clamp 10. The protection circuit 10 includes a forward trigger control circuit 5, a current limiting circuit 6, and a multi-gate high electron mobility transistor (HEMT) 9. The multi-gate HEMT 9 includes a drain/source region 7, a source/drain region 8, a first depletion-mode (D-mode) gate 1, a second D-mode gate 2, and an enhancement-mode (E-mode) gate 3. The E-mode gate 3 is positioned between the first D-mode gate 1 and the second D-mode gate 2. As shown in FIG. 1, the protection circuit 10 is electrically connected between a first terminal $N_1$ and a second terminal $N_2$.

The drain/source 7 and the first D-mode gate 1 are electrically connected to the first terminal $N_1$, and the source/drain 8 and the second D-mode gate 2 are electrically connected to the second terminal $N_2$. The forward trigger control circuit 5 is electrically connected between the first terminal $N_1$ and E-mode gate 3. The current limiting circuit 6 is electrically connected between the second terminal $N_2$ and the E-mode gate 3.

The multi-gate HEMT 9 can operate bi-directionally, and an operation of the drain/source 7 and the source/drain 8 as a drain or source can depend on the voltage conditions of the first and second terminals $N_1$, $N_2$. For example, when a voltage of the first terminal $N_1$ is greater than a voltage of the second terminal $N_2$, the drain/source 7 of the multi-gate HEMT 9 serves as a drain and the source/drain 8 of the multi-gate HEMT 9 serves as a source. In contrast, when a voltage of the first terminal $N_1$ is less than a voltage of the second terminal $N_2$, the drain/source 7 of the multi-gate HEMT 9 serves as a source and the source/drain 8 of the multi-gate HEMT 9 serves as a drain.

The first and second D-mode gates 1, 2 are depletion mode or normally-on gates having a threshold voltage that is less than or equal to about 0 V. In contrast, the E-mode gate 3 is an enhancement mode or normally-off gate having a threshold voltage greater than about 0 V. In one embodiment, the first and second D-mode gates 1, 2 have a threshold voltage in the range of about −1.0 V to about −2.0 V, and the E-mode gate 3 has a threshold voltage in the range of about 0.3 V to about 0.5 V.

The first and second D-mode gates 1, 2 are coupled to the drain/source region 7 and the source/drain region 8, respectively. Since the first and second D-mode gates 1, 2 are normally-on or depletion-mode structures, connecting the first and second D-mode gates 1, 2 in this configuration can be used to bias a first portion of the channel between the first D-mode gate 1 and the E-mode gate 3 to be about equal to the voltage of the first terminal $N_1$, and to bias a second portion of the channel between the second D-mode gate 2 and the E-mode gate 3 to be about equal to the voltage of the second terminal $N_2$.

The multi-gate HEMT 9 can be any suitable high electron mobility transistor, such as a gallium arsenide (GaAs), indium phosphide (InP), or gallium nitride (GaN) HEMT. As skilled artisans will appreciate, a HEMT can also be referred to as a modulation-doped field effect transistor (MODFET) or a heterojunction field effect transistor (HFET). In one embodiment, the multi-gate HEMT 9 is a pseudomorphic high electron mobility transistor (pHEMT).

The first and second terminals $N_1$, $N_2$ can operate within a defined range of voltage during normal circuit operating conditions. For example, in certain implementations, normal circuit operating conditions can be associated with a voltage difference between the first terminal $N_1$ and the second terminal $N_2$ between about 5 V and about 10 V. However, other suitable operating voltage conditions will be readily determined by persons having ordinary skill in the art.

In one embodiment, the first terminal $N_1$ is connected to a signal pad of an IC and the second terminal $N_2$ is connected to a power low or ground supply. However, other implementations are possible, such as configurations in which the first and second terminals $N_1$, $N_2$ are connected to power high and power low supplies, respectively.

The current limiting circuit 6 can operate to limit or impede a flow of current. In certain implementations, the current limiting circuit 6 includes a resistor and/or one or more other impedance elements configured to limit the flow of current through the current limiting circuit 6. Absent a trigger current from the forward trigger control circuit 5, the current limiting circuit 6 can bias the E-mode gate 3 based on the voltage of the second terminal $N_2$. For example, in one embodiment the current limiting circuit 6 biases the E-mode gate 3 to a voltage that is about equal to the voltage of the second terminal $N_2$.

The forward trigger control circuit 5 can operate in a high impedance state when a voltage difference between the first terminal $N_1$ and the second terminal $N_2$ is less than a forward trigger voltage of the forward trigger control circuit 5. However, when the voltage difference between the first terminal $N_1$ and the second terminal $N_2$ is greater than the forward trigger voltage, the forward trigger control circuit 5 can transition into a low impedance state and conduct a trigger current. The forward trigger control circuit 5 can be any suitable circuit, including, for example, one or more diodes connected in series to achieve a desired forward trigger voltage. However, other implementations of the forward trigger control circuit 5 can be used. For example, the forward trigger control circuit 5 can be any suitable circuit that provides high impedance when the voltage across the device is less than the forward trigger voltage and that provides low impedance when the voltage across the device is greater than or equal to the forward trigger voltage.

The forward trigger voltage can be selected to achieve a desired forward activation voltage of the protection circuit 10. In one embodiment, the forward trigger voltage is selected to be in the range of about 5 V to about 10 V. However, persons having ordinary skill in the art will readily appreciate other voltages, such as voltages that depend on system and/or process constraints.

During normal operating voltage conditions between the first and second terminals $N_1$, $N_2$, the protection circuit 10 can be in an off or high impedance state in which the flow of current between the first and second terminals $N_1$, $N_2$ is blocked. The protection circuit's high impedance state can be associated with the forward trigger control circuit 5 conducting a relatively small amount of current and the current limiting circuit 6 biasing the E-mode gate 3 based on the voltage of the second terminal $N_2$ so as to turn-off the E-mode gate 3. Thus, the protection circuit 10 operates in a low leakage/high impedance state for normal operating voltage conditions.

Additionally, the protection circuit 10 can be used to protect circuitry connected to the first and/or second terminals $N_1$, $N_2$ from a transient electrical event, such as an overvoltage and/or undervoltage event caused by user contact or generated by a manufacturer to test the robustness of an IC under a defined stress condition.

For example, the protection circuit 10 can provide a low impedance forward conduction path between the first and second terminals $N_1$, $N_2$ in response to an overvoltage event that increases a voltage of the first terminal $N_1$ relative to a voltage of the second terminal $N_2$. In particular, the forward trigger control circuit 5 can conduct a trigger current when a voltage of the first terminal $N_1$ exceeds a voltage of the second terminal $N_2$ by the forward trigger voltage of the forward trigger control circuit 5. The trigger current can increase the voltage of the E-mode gate 3, and the forward conduction path can turn on when a voltage difference between the E-mode gate 3 and the source/drain 8 is greater than the threshold voltage of the E-mode gate 3. As the positive stress voltage or overvoltage continues increasing, a portion of the trigger current can flow through the current limiting circuit 6, which can further increase a voltage difference between the E-mode gate 3 and the source/drain 8 and reduce the protection circuit's on-state resistance.

When the multi-gate HEMT 9 is turned-on, a low impedance forward conduction path is provided between the first and second terminals $N_1$, $N_2$. The forward conduction path includes a first current path from the first terminal $N_1$ to the second terminal $N_2$ though the drain/source 7 and the channel of the multi-gate HEMT 9. Additionally, at a sufficiently high gate voltage, a Schottky diode structure or metal-semiconductor junction associated with the first D-mode gate 1 can become forward-biased and provide a second current path between the first and second terminals $N_1$, $N_2$. The second current path reduces the protection circuit's on-state resistance, which can decrease the protection device's size and parasitic capacitance for a given protection current.

The protection circuit 10 is also configured to provide reverse conduction in response to an undervoltage event that increases the voltage of the second terminal $N_2$ relative to the voltage of the first terminal $N_1$. For example, as the voltage of the second terminal $N_2$ increases relative to the voltage of the first terminal $N_1$, the multi-gate HEMT 9 can turn on at a reverse trigger voltage that is about equal to the threshold voltage of the E-mode gate 3. The reverse conduction path includes a first current path from the second terminal $N_2$ to the first terminal $N_1$ through the source/drain 8 and the channel of the multi-gate HEMT 9. Additionally, when the voltage of the second terminal $N_2$ is sufficiently high, a Schottky diode structure associated with the gate of the second D-mode gate 2 can become forward-biased and provide a second current path between the first and second terminals $N_1$, $N_2$.

The protection circuit 10 can have a low parasitic capacitance relative to conventional protection circuits. For example, the multi-gate HEMT 9 can operate using multiple current paths, and thus can have a higher conductivity per unit area relative to conventional protection structures. Additionally, the protection circuit 10 can provide protection against both overvoltage and undervoltage events, and can thus have reduced overall capacitance relative to protection schemes using separate circuits for overvoltage and undervoltage protection.

Although the multi-gate HEMT 9 is illustrated as including three gates, the multi-gate HEMT 9 can be modified to include additional gates. For example, in one embodiment, the multi-gate HEMT 9 includes one or more additional gates positioned between the first and second D-mode gates 1, 2.

Figure 2:
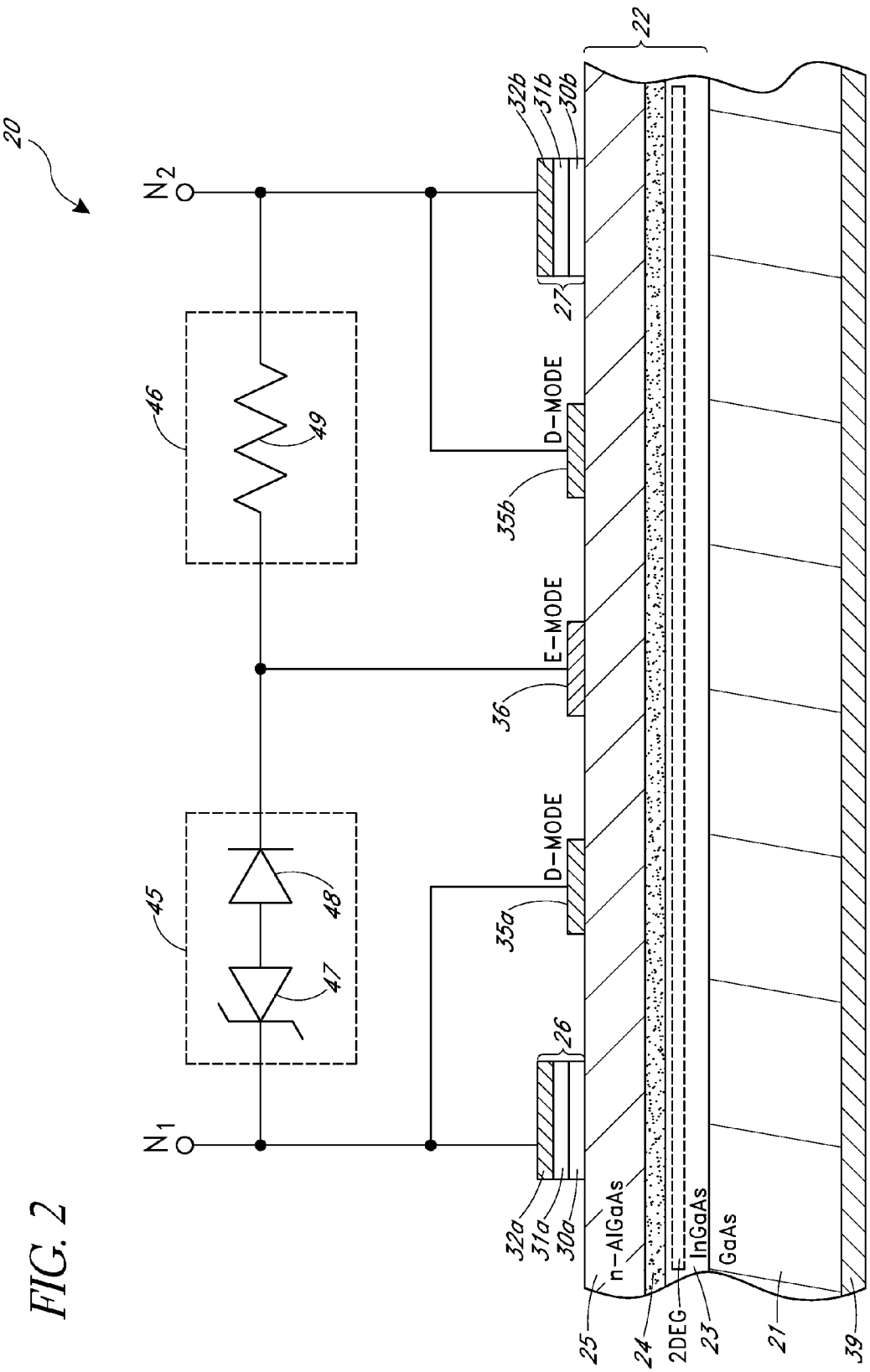
FIG. 2 is a cross-section of a compound semiconductor protection device implementing the heterojunction protection clamp of FIG. 1 according to one embodiment.

FIG. 2 is a cross-section of a compound semiconductor protection device 20 implementing the heterojunction protection clamp 10 of FIG. 1 according to one embodiment. The protection device 20 includes a gallium arsenide (GaAs) substrate 21, a heterojunction structure 22, a drain/source region 26, a source/drain region 27, a first D-mode gate region 35a, a second D-mode gate region 35b, an E-mode gate region 36, a backside conductor 39, a forward trigger control circuit 45, a current limiting circuit 46, a first terminal $N_1$, and a second terminal $N_2$.

The heterojunction structure 22 includes an indium gallium arsenide (InGaAs) layer 23 disposed over the GaAs substrate 21, a spacer layer 24 disposed over the InGaAs layer 23, and an n-type aluminum gallium arsenide (n-AlGaAs) layer 25 disposed over the spacer layer 24. The drain/source region 26 is disposed over the heterojunction structure 22 and includes a first n-type GaAs region 30a, a first highly doped n-type GaAs region 31a disposed over the first n-type GaAs region 30a, and a first contact region 32a disposed over the first highly doped n-type GaAs region 31a. Additionally, the source/drain region 27 is disposed over the heterojunction structure 22 adjacent the drain/source region 26, and includes a second n-type GaAs region 30b, a second highly doped n-type GaAs region 31b disposed over the second n-type GaAs region 30b, and a second contact region 32b disposed over the second highly doped n-type GaAs region 31b. In the illustrated configuration, the first and second highly doped n-type GaAs regions 31a, 31b have a higher doping concentration that the first and second doped n-type GaAs regions 30a, 30b.

The E-mode gate region 36 is disposed over the heterojunction structure 22 between the drain/source region 26 and the source/drain region 27. Additionally, the first D-mode gate region 35a is disposed over the heterojunction structure 22 between the E-mode gate region 36 and the drain/source region 26. Furthermore, the second D-mode gate region 35b is disposed over the heterojunction structure 22 between the E-mode gate region 36 and the source/drain region 27. In certain implementations, the first and second D-mode gate regions 35a, 35b and the E-mode gate region 36 include metal. For example, in one embodiment example, the first and second D-mode gate regions 35a, 35b and the E-mode gate region 36 include at least one of nickel (Ni), gold (Au), titanium (Ti), or platinum (Pt). As skilled artisans will appreciate, a metal-semiconductor junction associated with a gate of a HEMT can operate as a Schottky diode structure.

The GaAs substrate 21 can be an intrinsic substrate having a relatively low doping concentration. In certain implementations, the GaAs substrate 21 can have a relatively thin substrate thickness, such as a thickness in range of about 0.5 μm to about 1 μm. Configuring the GaAs substrate 21 to be relatively thin can aid in forming through-wafer vias (TWVs), which can be used to connect circuitry fabricated on the GaAs substrate 21 to the backside conductor 39. Although particular doping concentrations and thicknesses have been described, persons of ordinary skill in the art will readily determine other suitable values.

The heterojunction structure 22, the drain/source region 26, the source/drain region 27, the first D-mode gate region 35a, the second D-mode gate region 35b, and the E-mode gate region 36 operate as a multi-gate HEMT. For example, as skilled artisans will appreciate, diffusion of electrons from the n-AlGaAs layer 25 into the InGaAs layer 23 can result in the formation of a two-dimensional electron gas (2DEG) region or channel within the InGaAs layer 23. The conductivity of the 2DEG region can be altered or changed by controlling the gate voltages of the first D-mode gate region 35a, the second D-mode gate region 35b, and the E-mode gate region 36.

In one embodiment, the n-AlGaAs layer 25 has a thickness in the range of about 300 nm to about 500 nm, and a doping concentration in the range of about $1 \times 10^{18}$ atoms/cm$^3$ about $9 \times 10^{18}$ atoms/cm$^3$. The InGaAs layer 23 can be configured to have a relatively low doping concentration so as to enhance the mobility of electrons by reducing collisions between electrons and doping impurities. For example, in one embodiment the InGaAs layer 23 has a thickness in the range of about 5 nm to about 15 nm, and a doping concentration of less than about $1 \times 10^{18}$ atoms/cm$^3$. The spacer layer 24 can aid in reducing interface traps or defects between the interface of the InGaAs layer 23 and n-AlGaAs layer 25 associated with different lattice constants of the layers. In one embodiment, the spacer layer 24 includes a layer of AlGaAs having a thickness in the range of about 3 nm to about 6 nm. In certain implementations, one or more layers of the heterojunction structure 22 can be formed using an epitaxial growth process. Although particular doping concentrations and thicknesses have been described, persons of ordinary skill in the art will readily determine other suitable values.

The backside conductor 39 is disposed adjacent the GaAs substrate 21 on a side of the GaAs substrate 21 opposite the heterojunction structure 22. The backside conductor 39 can be electrically biased using a power low or ground supply, and TWVs formed in the GaAs substrate 21 can be used to provide electrical connections between circuitry and the ground supply. For example, in one embodiment the second terminal $N_2$ is electrically connected to the backside conductor 39 using one or more TWVs. In certain implementations, the backside conductor 39 includes at least one of gold (Au) or copper (Cu). Although the backside conductor 39 is illustrated as a single layer, the backside conductor 39 can include multiple sublayers, including, for example, seed and/or barrier sublayers.

The drain/source region 26 and the first D-mode gate region 35a are electrically connected to the first terminal $N_1$, and the source/drain region 27 and the second D-mode gate region 35b are electrically connected to the second terminal $N_2$. Additionally, the forward trigger control circuit 45 is electrically connected between the first terminal $N_1$ and the E-mode gate region 36, and the current limiting circuit 46 is electrically connected between the E-mode gate region 36 and the second terminal $N_2$.

The illustrated forward trigger control circuit 45 includes a reverse breakdown diode 47 and a diode 48. For example, the reverse breakdown diode 47 includes a cathode electrically connected to the first terminal $N_1$ and the diode 48 includes a cathode electrically connected to the E-mode gate region 36 and an anode electrically connected to an anode of the reverse breakdown diode 47.

The reverse breakdown diode 47 can be used to provide a relatively large reference breakdown voltage, thereby configuring the protection device with a relatively high forward blocking voltage. In certain implementations, the reverse breakdown diode 47 can be a Zener diode or another diode-based structure configured to emulate or operate similar to a Zener diode. For example, in some implementations the reverse breakdown diode 47 can include a reverse-biased junction diode that is doped or otherwise configured to provide a desired current-handling capability and/or reverse breakdown reference voltage. However, other configurations are possible, including implementations in which the reverse breakdown diode 47 includes a series combination of forward-biased Schottky diodes arranged to provide a desired reverse breakdown reference voltage. Using junction diodes and/or Schottky diodes can aid in providing a customizable and controllable reverse breakdown reference voltage, even when a protection device is fabricated in a relatively low-cost process in which Zener diodes are not readily available.

Although the forward trigger control circuit 45 illustrates one implementation of a suitable forward trigger control circuit, other implementations are possible. For example, in one embodiment using a relatively low forward trigger voltage, the reverse breakdown diode 47 and the diode 55 are omitted in favor of using one or more forward-biased diodes connected in series to provide a forward trigger voltage of a desired value.

The current limiting circuit 46 includes a current limiting resistor 49 electrically connected between the E-mode gate region 36 and the second terminal $N_2$. In one embodiment, the current limiting resistor 49 has a resistance selected to be in the range of about 5 kΩ to about 50 kΩ. However, persons having ordinary skill in the art will readily determine other suitable resistance values. Additionally, although one implementation of the current limiting circuit 46 has been illustrated in FIG. 2, other configurations are possible, including, for example, configurations in which the current limiting circuit 46 is implemented using active devices and/or configurations in which the resistor 49 is omitted or used in combination with other current limiting elements.

The protection device 20 can be used to provide protection from overvoltage and/or undervoltage events received between the first and second terminals $N_1$, $N_2$. For example, in response to an overvoltage condition, the forward trigger control circuit 45 can conduct a trigger current when a voltage of the first terminal $N_1$ exceeds a voltage of the second terminal $N_2$ by the forward trigger voltage of the forward trigger control circuit 45. The trigger current can increase the voltage of the E-mode gate region 36 and provide a forward conduction path between the first and second terminals $N_1$, $N_2$ when the voltage difference between the E-mode gate region 36 and the source/drain region 27 is greater than about the threshold voltage of the E-mode gate region 36. Additionally, a portion of the trigger current can flow through the current limiting circuit 46, which can increase a voltage difference between the E-mode gate region 36 and the source/drain region 27 and reduce the resistance of the forward conduction path.

The forward conduction path includes a first current path from the first terminal $N_1$ to the second terminal $N_2$ through the drain/source region 26 and the 2DEG region of the InGaAs layer 23. Additionally, at a sufficiently high gate voltage, a Schottky diode structure between the first D-mode gate region 35a and the n-AlGaAs layer 25 can become forward-biased and provide a second current path between the first and second terminals $N_1$, $N_2$ through the n-AlGaAs layer 25.

In response to an undervoltage condition between the first and second terminals $N_1$, $N_2$, the protection device 20 can provide reverse conduction through the 2DEG region when the voltage of the second terminal $N_2$ reaches a voltage sufficient to activate the E-mode gate region 36. Additionally, at a sufficiently high voltage, a Schottky diode structure between the second D-mode gate region 35b and the n-AlGaAs layer 25 can become forward-biased and provide an additional current path between the first and second terminals $N_1$, $N_2$ through the n-AlGaAs layer 25.

Although FIG. 2 illustrates one implementation of a protection device, other configurations can be used. Additionally, although the protection device has been illustrated in the context of a GaAs process, the teachings herein are applicable to other compound semiconductor technologies, including, for example, gallium nitride (GaN) and indium phosphide (InP) technologies. Accordingly, in certain embodiments, the GaAs substrate 21, the drain/source region 26, the source/drain region 27, and/or the heterojunction structure 22 can include other materials suitable for use in compound semiconductor processing.

Figure 3:
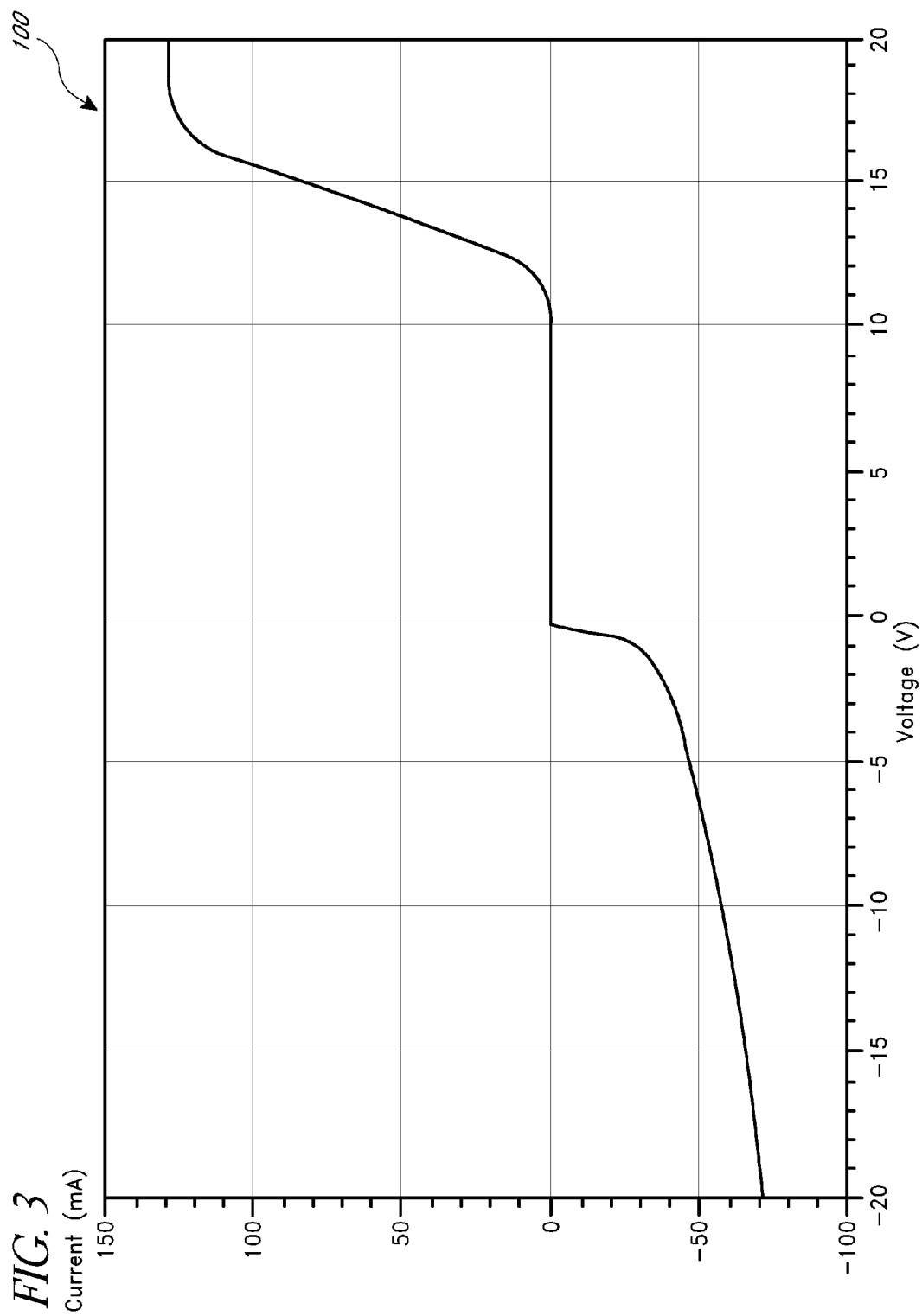
FIG. 3 is a graph of voltage versus current for one example of the heterojunction protection clamp of FIG. 1.

FIG. 3 is a graph 100 of voltage versus current for one example of the heterojunction protection clamp 10 of FIG. 1. Voltage is expressed along a horizontal axis, and current is expressed along a vertical axis. The graph 100 illustrates a current versus voltage response for a configuration of heterojunction protection clamp 10 of FIG. 1 in which the forward trigger voltage has been configured to be about 12 V and in which the E-mode gate threshold voltage is about 0.3 V. However, the forward trigger voltage and/or the E-mode gate threshold voltage can be configured to be other values. As shown in FIG. 3, the heterojunction protection clamp can provide both overvoltage and undervoltage protection.

Figure 4:
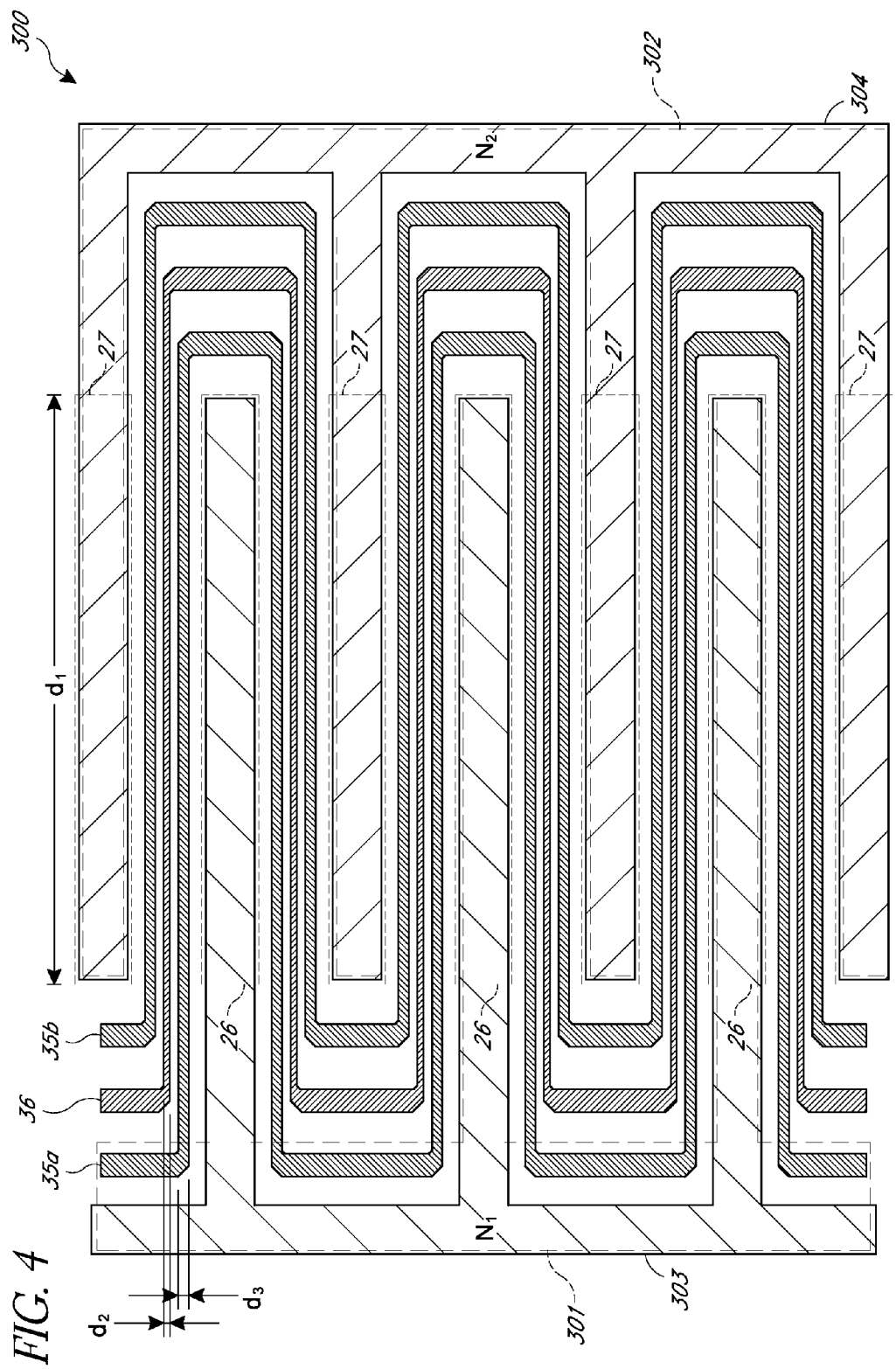
FIG. 4 is a plan view of a compound semiconductor protection device implementing the multi-gate high electron mobility transistor (HEMT) of FIG. 1 according to one embodiment.

FIG. 4 is a plan view of a compound semiconductor protection device 300 implementing the multi-gate HEMT 9 of FIG. 1 according to one embodiment. The protection device 300 includes drain/source regions 26, source/drain regions 27, first and second D-mode gate regions 35a, 35b, an E-mode gate region 36, a first lower metal or METAL1 region 301, a second METAL1 region 302, a first upper metal or METAL2 region 303, and a second METAL2 region 304. The compound semiconductor protection device 300 is fabricated on a substrate, such as a GaAs substrate, and can include other structures or features including, for example, a heterojunction structure, contact regions, vias, and/or additional metal regions. Skilled artisans will appreciate that these details have been omitted from this figure for clarity.

The drain/source regions 26 and the source/drain regions 27 have been arranged adjacent one another in a column with each drain/source region 26 positioned between two adjacent source/drain regions 27. In the illustrated configuration, each of the drain/source regions 26 and the source/drain regions 27 have a width $d_1$, which in certain implementations can be, for example, in the range of about 50 μm to about 1000 μm. However, persons having ordinary skill in the art will readily appreciate other suitable region widths. Although FIG. 6 illustrates a configuration using three drain/source regions 26 and four source/drain regions 27, the protection device 300 can include more or fewer drain/source regions 26 and/or source/drain regions 27. For example, in one embodiment the total number of drain/source regions 26 and source/drain regions 27 is selected to be in the range of about 2 to about 24.

The first and second D-mode gate regions 35a, 35b and the E-mode gate region 36 have been implemented as serpentine-shaped structures that wind or turn between the drain/source regions 26 and the source/drain regions 27. As illustrated in FIG. 4, the E-mode gate region 36 has a width $d_2$ and the first and second D-mode gate regions 35a, 35b have a width $d_3$. In one embodiment, the width $d_3$ of the first and second D-mode gate regions 35a, 35b is selected to be between about 2 times to about 5 times greater than the width $d_2$ of the E-mode gate region 36. However, other configurations are possible. Additionally, although FIG. 4 illustrates a configuration in which the D-mode gate regions have matching widths, in other implementations the D-mode gate widths can be asymmetric.

The first METAL1 region 301 has been configured to provide electrical connections between different portions of the first D-mode gate region 35a. For example, the illustrated first D-mode gate region 35a is serpentine-shaped and includes turns having edge portions, and the first METAL1 region 301 has been used to electrically connect edge portions associated with a first or left side of the device. Connecting the first METAL1 region 301 in this manner can reduce the resistance of first D-mode gate region 35a, thereby helping the device to conduct current uniformly. In certain implementations, the first METAL2 region 303 is disposed over and electrically connected to at least a portion of the first METAL1 region 301 so as to further reduce gate resistance and promote uniform current conduction. As shown in FIG. 6, portions of the first METAL1 region 301 have been configured to extend between turns of the first D-mode gate region 35a and electrically contact the drain/source regions 26. The first METAL1 region 301 and/or the first METAL2 region 303 can operate as the first terminal $N_1$ of the protection device 300.

The second METAL1 region 302 has been configured to provide electrical connections between edge portions of the second D-mode gate region 35b associated with a second or right side of the device. Additionally, portions of the second METAL1 region 302 have been configured to extend between turns of the second D-mode gate region 35b and electrically contact the source/drain regions 27. In certain implementations, the second METAL2 region 304 is disposed over and electrically connected to at least a portion of the second METAL1 region 302. The second METAL1 region 302 and/or the second METAL2 region 304 can operate as the second terminal $N_2$ of the protection device 300.

Additional details of the protection device 300 can be similar to those described earlier with reference to FIGS. 1-2. Although the protection device 300 illustrates one implementation of a suitable layout for a compound semiconductor protection device, other implementations can be used.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described above, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described above.

Applications

Devices employing the above described protection schemes can be implemented into various electronic devices and interface applications. Examples of the electronic devices can include, but are not limited to, consumer electronic products, parts of the consumer electronic products, electronic test equipment, high robustness industrial and automotive applications, etc. Examples of the electronic devices can also include circuits of optical networks or other communication networks. The consumer electronic products can include, but are not limited to, a mobile phone, a telephone, a television, a computer monitor, a computer, a hand-held computer, a personal digital assistant (PDA), an automobile, a vehicle engine management controller, a transmission controller, a seatbelt controller, an anti-lock brake system controller, a camcorder, a camera, a digital camera, a portable memory chip, a washer, a dryer, a washer/dryer, a copier, a facsimile machine, a scanner, a multi functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
a multi-gate high electron mobility transistor (HEMT) comprising a drain/source, a source/drain, a first depletion-mode (D-mode) gate, a second D-mode gate, and an enhancement-mode (E-mode) gate, wherein the E-mode gate is disposed between the first and second D-mode gates, wherein the drain/source and the first D-mode gate are electrically connected to a first terminal, and wherein the source/drain and the second D-mode gate are electrically connected to a second terminal;
a current limiting circuit electrically connected between the E-mode gate and the second terminal; and
a forward trigger control circuit electrically connected between the first terminal and the E-mode gate, wherein the forward trigger control circuit is configured to conduct a trigger current when a voltage of the first terminal exceeds a voltage of the second terminal by a forward trigger voltage, and wherein the trigger current is configured to turn-on the E-mode gate to provide a forward conduction path between the first terminal and the second terminal.

2. The apparatus of claim 1, wherein the forward conduction path comprises a first current path between the first terminal and the second terminal through a two-dimensional electron gas (2DEG) region of the multi-gate HEMT, and wherein the forward conduction path further comprises a second current path between the first terminal and the second terminal through a Schottky diode structure associated with the first D-mode gate.

3. The apparatus of claim 2, wherein the current limiting circuit is configured to pass at least a portion of the trigger current.

4. The apparatus of claim 1, wherein the current limiting circuit is configured to bias the E-mode gate based on the voltage of the first terminal when a voltage difference between the first and second terminals is less than the forward trigger voltage.

5. The apparatus of claim 4, wherein the E-mode gate is configured to turn on to provide a reverse conduction path between the second terminal and the first terminal when the voltage of the second terminal exceeds the voltage of the first terminal by about a threshold voltage of the E-mode gate.

6. The apparatus of claim 1, wherein the current limiting circuit comprises a resistor.

7. The apparatus of claim 1, wherein the forward trigger control circuit comprises a reverse breakdown diode and a first diode, wherein the reverse breakdown diode comprises a cathode electrically connected to the first terminal, and wherein the first diode comprises a cathode electrically connected to the E-mode gate and an anode electrically connected to an anode of the reverse breakdown diode.

8. The apparatus of claim 7, wherein the reverse breakdown diode comprises at least one of a Zener diode, a reverse-biased junction diode, or a plurality of forward-biased Schottky diodes arranged in series.

9. The apparatus of claim 1, wherein the multi-gate HEMT is a pseudomorphic high electron mobility transistor (pHEMT).

10. An apparatus comprising:
a substrate;
a heterojunction structure disposed over the substrate;
a drain/source region disposed over the heterojunction structure and electrically connected to a first terminal;
a source/drain region disposed over the heterojunction structure and electrically connected to a second terminal;
an enhancement-mode (E-mode) gate region disposed over the heterojunction structure between the drain/source region and the source/drain region;
a first depletion-mode (D-mode) gate region disposed over the heterojunction structure between the drain/source region and the E-mode gate region, wherein the first D-mode gate region is electrically connected to the first terminal;
a second D-mode gate region disposed over the heterojunction structure between the source/drain region and the E-mode gate region, wherein the second D-mode gate region is electrically connected to the second terminal;
a current limiting circuit electrically connected between the E-mode gate region and the second terminal; and
a forward trigger control circuit electrically connected between the first terminal and the E-mode gate region.

11. The apparatus of claim 10, wherein the substrate comprises gallium arsenide.

12. The apparatus of claim 10, wherein the heterojunction structure comprises an indium gallium arsenide region and an n-type aluminum gallium arsenide region.

13. The apparatus of claim 10, wherein the heterojunction structure comprises a two-dimensional electron gas region disposed beneath the first D-mode gate region, the E-mode gate region, and the second D-mode gate region.

14. The apparatus of claim 10, wherein the current limiting circuit comprises a resistor.

15. The apparatus of claim 10, wherein a width of the first and second D-mode gate regions is between about 2 times to about 5 times greater than a width of the E-mode gate region.

16. The apparatus of claim 10, wherein the first terminal is electrically connected to a signal pad.

17. The apparatus of claim 10, further comprising a backside conductor disposed on a side of the GaAs substrate opposite the heterojunction structure, wherein the second terminal is electrically connected to the backside conductor.

18. A method of making a protection clamp, the method comprising:

forming a heterojunction structure over a substrate;

forming a drain/source region over the heterojunction structure;

forming a source/drain region over the heterojunction structure;

forming an enhancement-mode (E-mode) gate region over the heterojunction structure, wherein the E-mode gate region is disposed between the drain/source region and the source/drain region;

forming a first depletion-mode (D-mode) gate region over the heterojunction structure, wherein the first D-mode gate region is disposed between the drain/source region and the E-mode gate region;

forming a second D-mode gate region disposed over the heterojunction structure, wherein the second D-mode gate region is disposed between the source/drain region and the E-mode gate region;

forming a current limiting circuit, wherein the current limiting circuit includes a first terminal electrically connected to the E-mode gate region and a second terminal electrically connected to the second D-mode gate region and to the source/drain region; and forming a forward trigger control circuit, wherein the forward trigger control circuit includes a first terminal electrically connected to the E-mode gate region and a second terminal electrically connected to the first D-mode gate region and to the drain/source region.

19. The method of claim 18, wherein the substrate comprises gallium arsenide.

20. The method of claim 18, wherein forming the heterojunction structure comprises forming an indium gallium arsenide region adjacent an n-type aluminum gallium arsenide region.

* * * * *